United States Patent [19]

Hemmah et al.

[11] Patent Number: 4,771,011

[45] Date of Patent: * Sep. 13, 1988

[54] ION-IMPLANTED PROCESS FOR FORMING IC WAFER WITH BURIED-ZENER DIODE AND IC STRUCTURE MADE WITH SUCH PROCESS

[75] Inventors: Steven M. Hemmah, Salem, N.H.; Richard S. Payne, Andover, Mass.

[73] Assignee: Analog Devices, Incorporated, Norwood, Mass.

[*] Notice: The portion of the term of this patent subsequent to Jul. 22, 2003 has been disclaimed.

[21] Appl. No.: 60,765

[22] Filed: Jun. 10, 1987

Related U.S. Application Data

[62] Division of Ser. No. 771,428, Aug. 30, 1985, abandoned, which is a division of Ser. No. 608,469, May 9, 1984, abandoned.

[51] Int. Cl.$^4$ ............... H01L 21/265; H01L 21/223
[52] U.S. Cl. ............................ 437/26; 357/13; 357/91; 437/904
[58] Field of Search ............ 437/26, 904; 357/13, 357/91

[56] References Cited

U.S. PATENT DOCUMENTS 4,213,806  7/1980  Tsang ............................ 437/904
4,590,664  5/1986  Prentice et al. .................. 437/904
4,601,760  7/1986  Hemmah et al. ................. 437/904

FOREIGN PATENT DOCUMENTS 58-16574  1/1983  Japan .

Primary Examiner—Upendra Roy
Attorney, Agent, or Firm—Parmelee, Bollinger & Bramblett

[57] ABSTRACT

A new process making it possible to produce stable buried Zener diodes in large-sized wafers where slow ramping of diffusion temperatures is required to avoid crystal damage and other adverse effects. The process includes an initial deep ion implantation of p type dopant (boron). A second ion implantation of n type dopant (arsenic) is made over the p type implantation. Both implantations are driven in to the required degree. An additional p type dopant diffusion is made coincident with the base formation by ion implantation to establish connection to the original deep p-doped region, and an additional n type dopant diffusion is made coincident with the emitter formation to establish connection with the n type dopant implantation.

3 Claims, 5 Drawing Sheets

DIFFUSION PROFILE OF P++($M^{2.7}$ 1ST BORON IMPLANT)
PLUS DIFFUSION PROFILE OF P+(M3 2ND BORON IMPLANT)
FROM X TO X' ALONG THE SILICON—SILICON DIOXIDE INTERFACE

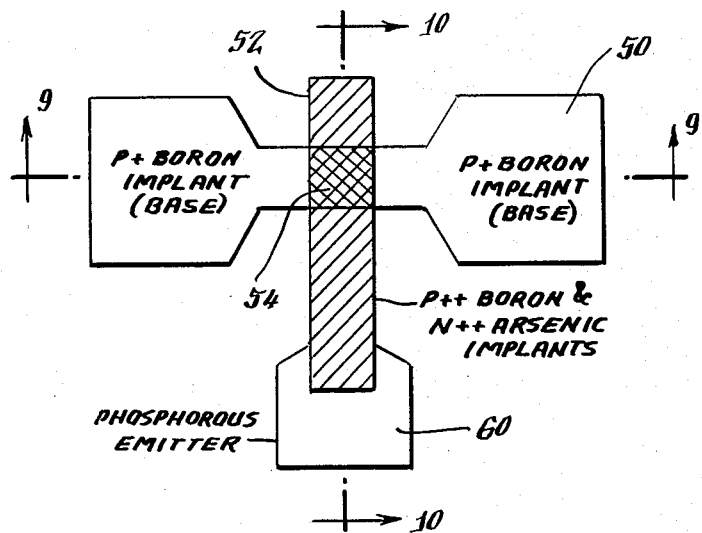
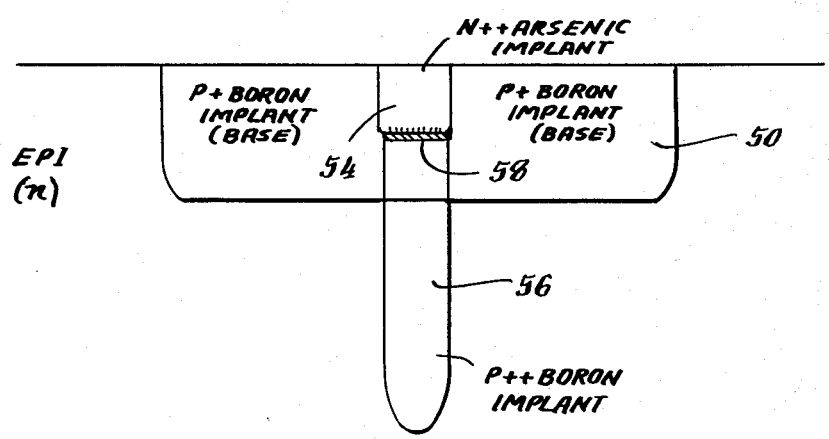
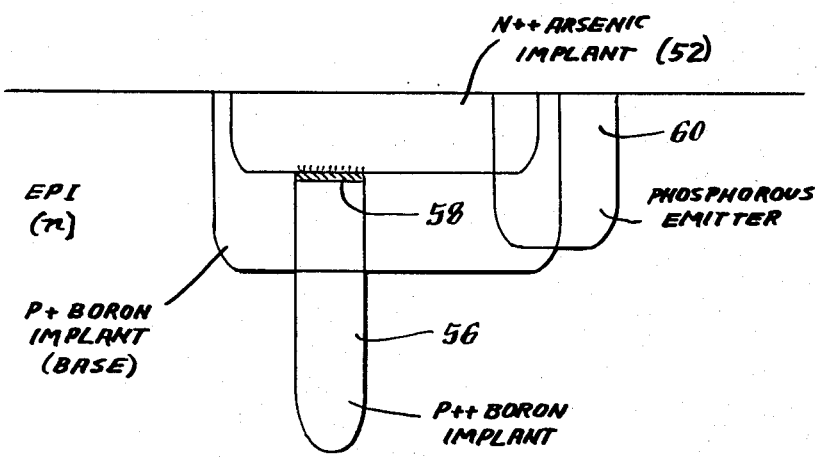

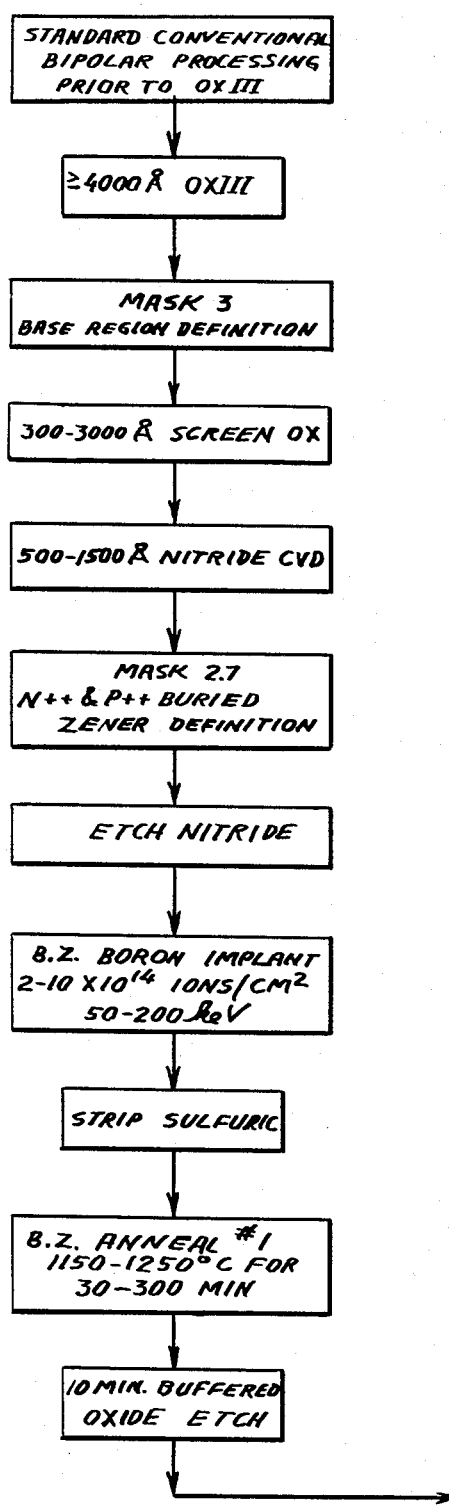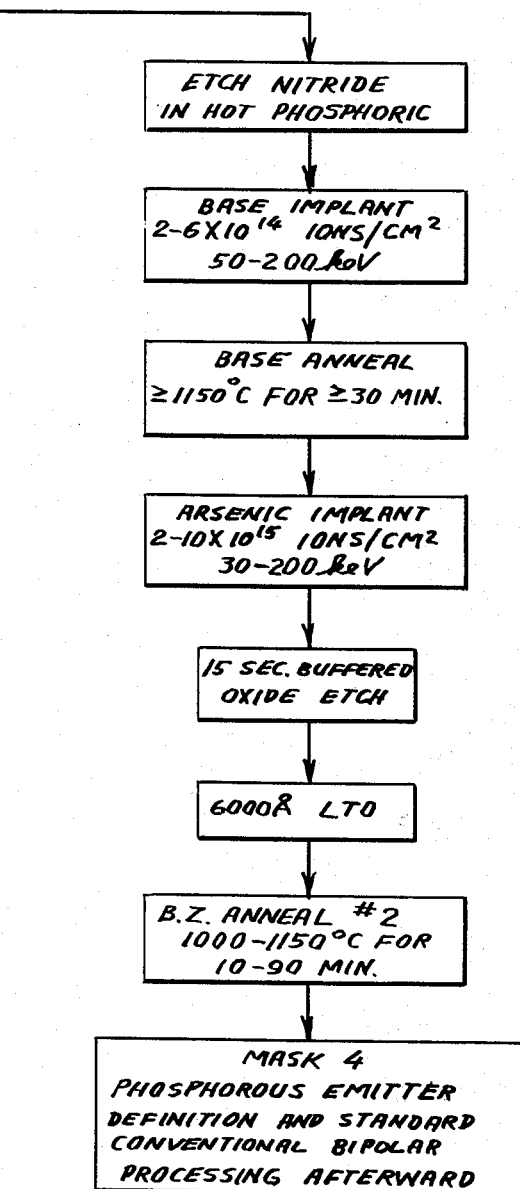
Fig. 11.

ION-IMPLANTED PROCESS FOR FORMING IC WAFER WITH BURIED-ZENER DIODE AND IC STRUCTURE MADE WITH SUCH PROCESS

This application is a divisional of co-pending application Ser. No. 771,428 filed on Aug. 30, 1985, abandoned which is a divisional of Ser. No. 608,469 filed May 9, 1984, now abandoned.

BACKGROUND OF THE INVENTION

1. Field of the Invention

This invention relates to integrated circuit (IC) wafers of the type including Zener diodes to provide reference voltages. More particularly, this invention relates to forming such a Zener diode wherein the junction breakdown occurs in a sub-surface region in order to insure stable operation.

2. Description of the Prior Art

U.S. Pat. No. 4,213,806, issued to W. K. Tsang on July 22, 1980, describes a method for diffusing wafers so as to form IC chips with Zener diodes having sub-surface breakdown junctions, i.e. so-called buried Zener diodes. The procedure employs a triple diffusion process compatible with conventional bipolar processing. In the first step, a deep p++ diffusion is applied, reaching through the epitaxial layer (Epi) to the buried n+ layer; this deep diffusion is carried out simultaneously with the isolation diffusion for the other components of the wafer. Next, a shallow p+ diffusion is formed over the deep p++ diffusion and is arranged to extend out laterally well beyond opposite edges of the deep diffusion. This second diffusion is carried out simultaneously with the base diffusion for the wafer. Finally, a shallow n+ diffusion is applied over the p diffusions, to form a sub-surface breakdown junction with the p-doped material, adjacent the central regions thereof, and avoiding breakdown at the surface junction between the n+ and p+ diffusions. This last diffusion is carried out simultaneously with the emitter diffusion for the wafer.

The procedures described in the above Tsang patent have gone into substantial commercial use, and have provided excellent results. However, difficulties have arisen when attempts have been made to apply that procedure to relatively large-sized wafers such as those 4" in diameter. Specifically, it has been found that there is a tendency for the Zener diodes to break down at higher than specified voltages, approaching and often exceeding the break down at surface junctions, thus causing potentially unstable performance.

U.S. Pat. No. 4,079,402 (Dunkeley et al) shows a Zener diode formed by a procedure including the use of ion implantation. This disclosure however does not provide any teaching for solving the problem discussed hereinabove. Dunkeley et al do not provide a sub-surface breakdown junction formed on both sides by ion implantation.

SUMMARY OF THE INVENTION

It has been found that the difficulties in forming buried Zener diodes by applying known techniques to large-sized wafers are associated with the relatively slow ramping of process temperatures employed with large wafers during the high temperature diffusions. Such slow ramping of temperatures is required to avoid crystal damage and its attendant adverse impact on yield and noise. The slowing of the temperature ramp is quite substantial. For example, with the smaller-sized 2" or possibly 3" wafers, the ramp down of diffusion temperature to room temperature might take 10 minutes or so, whereas for 4" wafers such transition might require in excess of an hour. Such a significantly slowed ramp-down alters the diffusion process markedly, especially where phosphorous diffusions are involved. More specifically, the slowed ramp-down increases the breakdown voltage of the Zener diode p junctions and adversely impacts the window of voltage available for the fabrication of a buried Zener diode.

In accordance with the present invention, such difficulties are avoided by employing a new procedure for forming Zener diodes. In a preferred procedure to be described herein, an initial deep diffusion of p type dopant is carried out by ion implantation of p++ boron, using known ion implantation techniques. The n type dopant for the junction also is diffused by implantation of n++ arsenic ions overlying the boron implantation, and forming a horizontal sub-surface breakdown junction therewith. An additional diffusion of p type dopant is made (preferably using ion implantation) to overlap with the original deep implantation, to provide for making electrical connection between that original ion implantation and the surface of the wafer. An additional n type diffusion also is made for example by chemical vapor deposition of phosphorous to overlap the original n type ion implantation and to provide for making electrical connection to that original n type diffusion.

The diffusions are made in such a fashion that the concentration of p type dopant at the below-surface horizontal junction with the n type ion implantation is greater than the p type dopant at the surface junction with the n type dopant. The resulting Zener diodes predominantly achieve consistently uniform sub-surface breakdowns at voltages within a proper design window, and provide significant improvement in yield factors.

Accordingly, it is an object of the present invention to provide a superior procedure for forming Zener diodes in large-size wafers requiring relatively long temperature ramps. Other objects, aspects and advantages of the invention will in part be pointed out in, and in part apparent from, the following detailed description of preferred processing procedures, considered together with the accompanying drawings.

BRIEF DESCRIPTION OF THE DRAWINGS

FIG. 8 is a plan view of an IC wafer showing a modified configuration of p type and n type diffusions to provide a Zener diode with stable sub-surface breakdown;

FIG. 9 is a sectional view taken along line 9—9 of FIG. 8;

FIG. 10 is a sectional view taken along line 10—10 of FIG. 8; and

FIG. 11 is a flow diagram illustrating process steps involved in producing the Zener diode of FIG. 8.

DETAILED DESCRIPTION OF THE PREFERRED EMBODIMENTS

Figure 1:
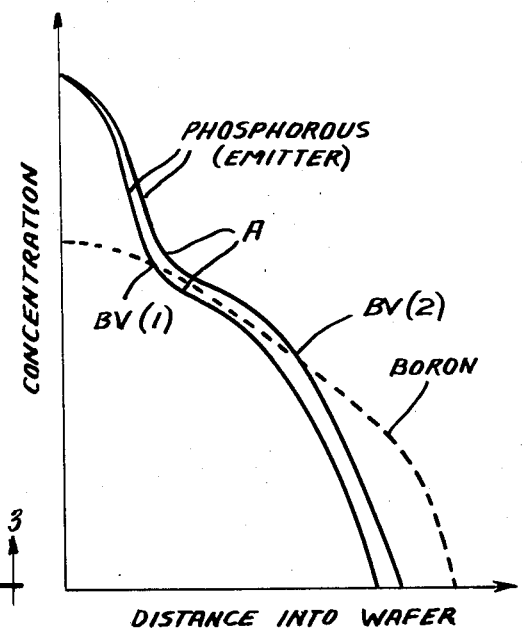
FIG. 1 is a graph presenting typical high-concentration phosphorous diffusion profiles in silicon, together with a typical diffusion profile for boron.

Before describing the invention, a brief discussion of the nature of the problem will first be presented. Referring to FIG. 1, it has been known that the diffusion profile of phosphorous has an unusual characteristic "kink", as indicated at A. (Two phosphorous curves are shown in order to demonstrate how the normal variation in depth of diffusion from unit to unit can have a significant effect on the results.) Moreover, experience with phosphorous diffusions has indicated that this characteristic "kink" may be strongly accentuated if relatively long temperature ramps are used to return the wafer to room temperature. Under those circumstances, and with a typical boron diffusion profile as indicated in FIG. 1, it will be seen that the boron curve can be approximately parallel to the phosphorous curve, and close to the phosphorous curve, over a relatively large distance into the wafer.

Breakdown of the junction occurs at the intersection of the phosphorous and boron curves. For the left-hand phosphorous curve, this will be at BV(1). However, with a slight shift in phosphorous depth, represented by the right-hand curve, the intersection will be at BV(2), representing a signficantly higher breakdown voltage. Thus it will be seen that an unacceptably large variation in results can occur, as the depth of diffusion varies only slightly from unit to unit. In fact, if the breakdown voltage of the buried p/n junction becomes high enough, unstable surface-junction breakdowns will occur instead, i.e. if $BV_{EBO} < BV_Z$ then the breakdown will occur at the surface, and will likely be unstable. Thus the characteristics presented by FIG. 1 represent a serious difficulty with known procedures.

This problem has been solved in accordance with the present invention by specially controlling the diffusion profile for the sub-surface junction by the use of ion implantation as will be described in more detail hereinbelow.

Figure 2:
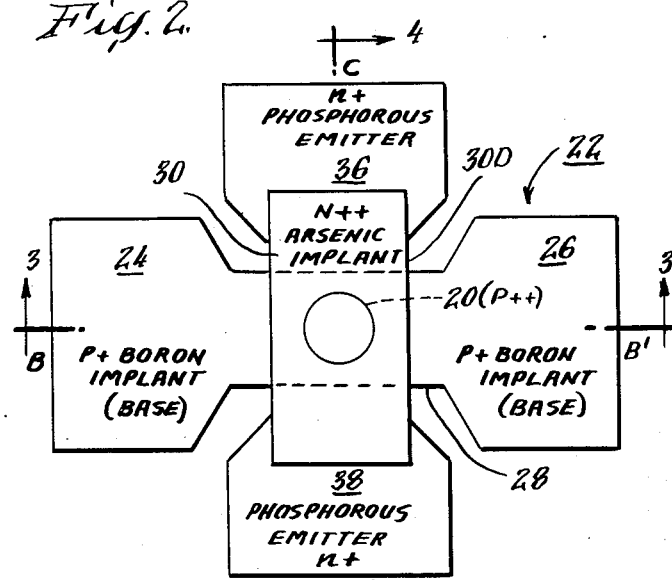
FIG. 2 is a plan view of an IC wafer with p type and n type dopant diffusions arranged to provide a Zener diode with a stable sub-surface breakdown in accordance with this invention.
Figure 3:
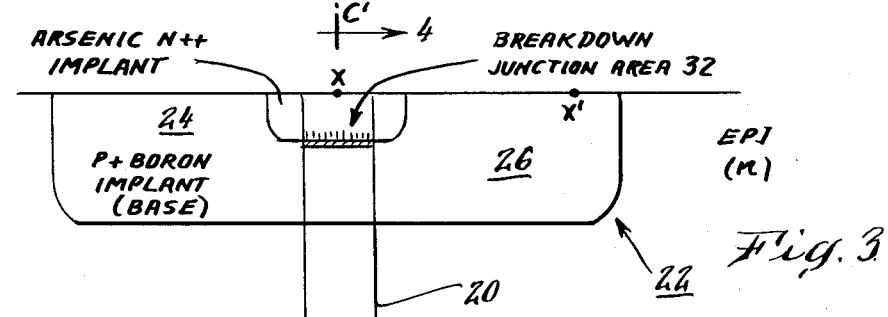
FIG. 3 is a sectional view taken along line 3—3 of FIG. 2.
Figure 4:
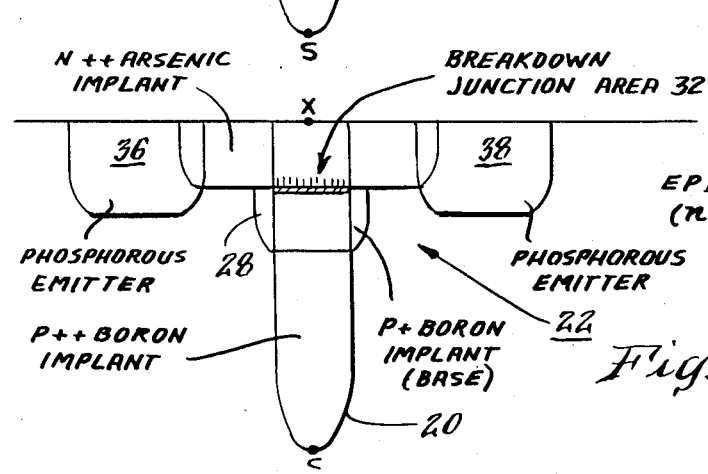
FIG. 4 is a sectional view taken along line 4—4 of FIG. 2.

Referring now to FIGS. 2-4, in the presently preferred technique of forming a buried Zener diode, a deep ion implantation 20 of p++ boron is first made into the epitaxial layer of the wafer. This implantation is made with a generally circular cross-section, of relatively small diameter. Next, a shallower boron ion implantation, generally indicated at 22, is made to overlie the original deep implantation 20. This shallower implantation is of lower concentration (p+) and extends out laterally on opposite sides of the p++ implant, along a line BB', forming approximately rectangular regions 24, 26, identified as base regions. The shallow p+ implantation also includes a reduced-width central segment 28 joining the base regions 24, 26, and positioned symmetrically over the circular deep p++ implantation 20. The base regions 24, 26 and the joining segment 28 enable electrical connection to be made to the deep p++ ion implantation region 20.

An n++ arsenic ion implantation 30 then is made over the original p++ implantation 20 and portions of the central p+ segment 28. This implantation is arranged to extend laterally well beyond the edges of the p++ implantation and, as seen in FIGS. 2 and 3, forms a horizontal sub-surface junction area 32 with the p++ implantation to define the buried-Zener diode.

Figure 5:
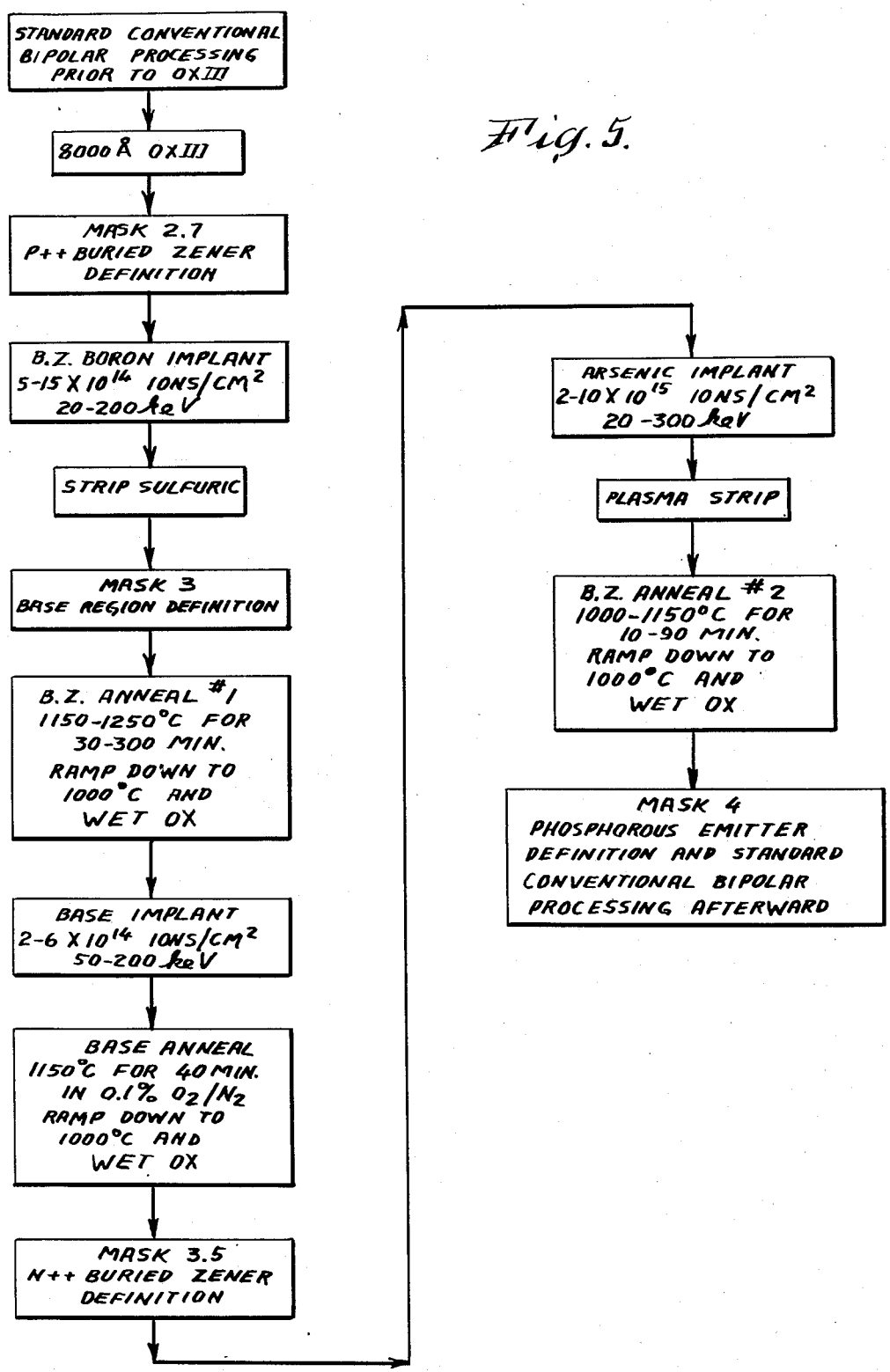
FIG. 5 is a flow diagram detailing the process steps involved in making the Zener diode of FIGS. 2-4.

The flow diagram of FIG. 5 sets forth exemplary processing steps which can be used in forming the buried-Zener structure of FIGS. 2-4. At the outset, the wafer is processed in accordance with standard preliminary procedures for bipolar ICs, as well known in the art. Next, at the start of the buried-Zener processing, the wafer is provided with an oxide coating, e.g. 8000 Å (Angstroms). Photo-resist then is applied, and a buried-Zener definition is effected (by a mask identified in the diagram as No. 2.7) to remove the oxide coating in the circular region 20 (FIG. 2). Thereafter, the wafer is subjected to ion implantation of boron, e.g. at an energy of between 20 and 200 keV and a concentration of $5-15 \times 10^{14}$ ions/cm$^2$ to form the p++ region 20.

The hardened photo-resist over the remaining oxide on the wafer then is removed by a sulfuric acid strip (a procedure which does not affect the oxide coating). Thereafter a standard base masking step is carried out (Mask 3) with photo-resist, to define the base regions of the NPN transistors to be formed in the wafer. In this case, however, the base regions which are defined also include the two offset rectangular regions 24, 26 and the narrowed segment 28 over the p++ implantation 20.

The first buried-Zener anneal then is carried out, e.g. at a temperature of 1150°-1250° C. for 30-300 minutes in a low oxygen ambient. This "drives in" the implanted boron to a substantial depth, desirably to about 3-6 microns, as illustrated in the sectional views of FIGS. 3 and 4. Also, the anneal serves to correct damage to the crystalline structure resulting from the ion implantation procedure.

This anneal step includes a temperature rampdown to 1000° C. and a wet oxidation treatment to cover the bare silicon of the base regions with, for example, 2000-60000 Å of oxide. The field oxide will be augmented by this treatment, reaching a total thickness of perhaps 10,000 Å.

Next, a boron p+ implantation is carried out into the base regions 24, 26, 28 just defined. Such ion implantation may be carried out with an energy of 50-200 keV, and a concentration of $2-6 \times 10^{14}$ ions/cm$^2$. The base implantation then is annealed at a temperature of $\geq 1150°$ C. for $\geq 30$ minutes, in a low oxidating ambient, followed by a temperature ramp-down to 1000° C. and a wet oxide treatment for about 20 minutes.

Another photo-resist masking sequence then is carried out (Mask 3.5) to define the rectangular region 30 for the n++ arsenic ion implantation. This defined region is etched down to bare silicon, leaving the base and field areas still covered by oxide. An n++ arsenic implantation then is made into the exposed area at an energy of 20-200 keV, and with a concentration of $2-10 \times 10^{15}$ ions/cm$^2$. The remaining photo-resist layer in the non-defined regions helps to block implantation of arsenic ions in those areas.

A plasma strip then is made, to take off the remaining (hardened) photo-resist material. This is followed by another buried-Zener anneal (#2), e.g. at a temperature of 1000°-1150° C. for 10-90 minutes, together with a temperature ramp-down to 1000° C. and wet oxidation for about 20 minutes.

Thereafter, and during the conventional emitter definition step for the NPN transistors to be formed in the wafer, the offset regions 36, 38 joining the implanted n++ region 30 are defined by photo-resist. The standard emitter diffusion into the wafer produces corresponding diffusions in those regions 36, 38, as shown in the sectional views. Preferably, these diffusions are made by chemical source diffusion for phosphorous in known fashion, although other techniques (doped oxide, ion implantation) might be used.

The formation of surface contact metallization at the emitter regions 36, 38 establishes electrical connection to the n++ portion of the buried-Zener diode. Similarly, surface contact metallization at the base regions 24, 26 establishes electrical connection to the p++ portion of the buried-Zener diode.

Figure 6:
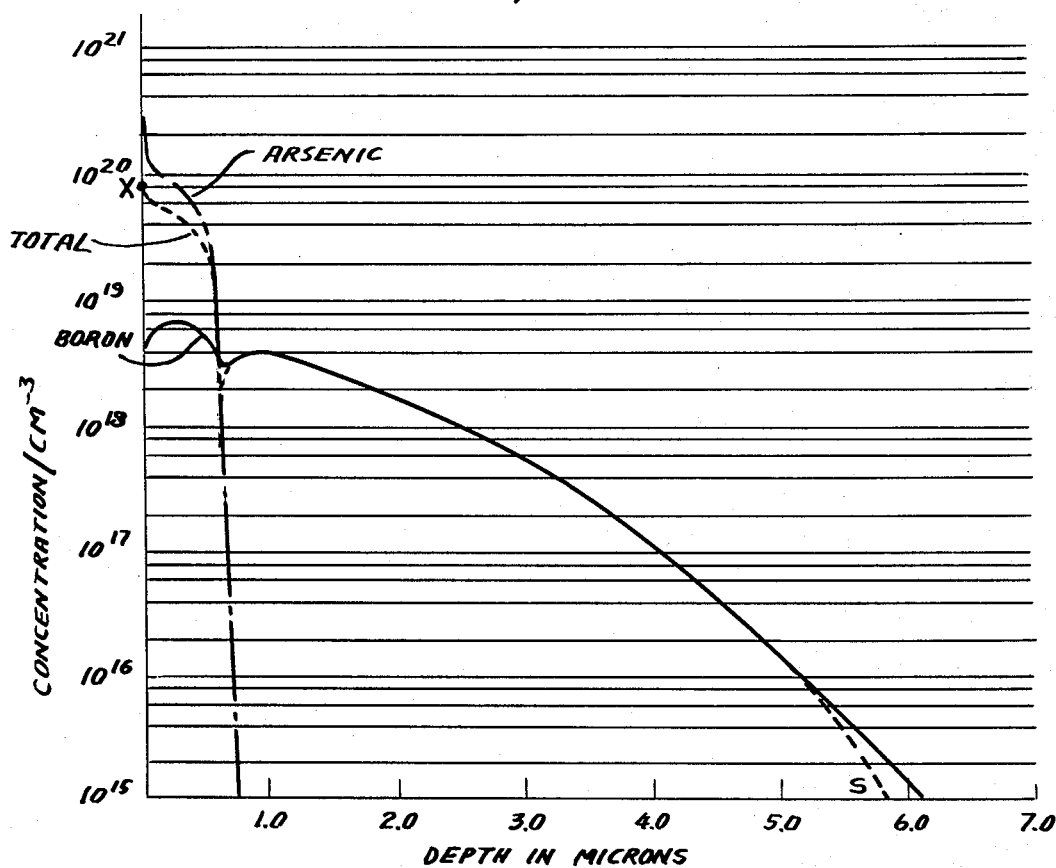
FIG. 6 shows the concentration profile of dopants in the FIG. 2 embodiment.
Figure 7:
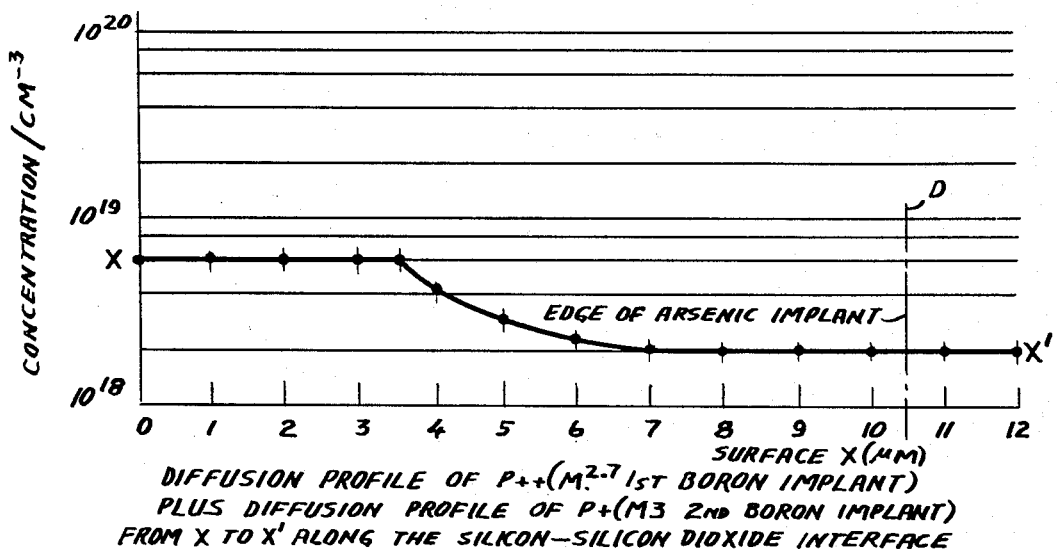
FIG. 7 shows the concentration profile of p type dopant along the surface of the diode of FIGS. 2-4, between points X,X' of FIG. 3.

FIG. 6 is a graph showing the concentration profile of a typical buried-Zener diode formed as described above. The boron and arsenic concentrations are shown as separate curves. A third curve represents the total concentration starting at the central point X on the wafer surface, as indicated in FIGS. 3 and 4. FIG. 7 shows the variation in surface concentration of boron from point X to a laterally distant surface point X'.

The position of the edge 30D (see FIG. 2) of the n++ arsenic implant 30 is indicated in FIG. 7 by the letter D. It will be seen from FIG. 7 that the concentration of boron at this edge point (D) is about one-half to one-third of the concentration of boron at the sub-surface breadkown junction (see FIG. 6). Thus, the Zener breakdown will take place predominantly at the sub-surface junction rather than at the surface, assuring stable diode operation at a desired voltage level.

This specified ratio relationship between the boron concentrations at the surface and sub-surface junctions is moreover maintained consistently from unit to unit, at least in part due to the characteristics of ion implantation. Ion implantation is especially effective in that regard because superior control is exercised over the dopant concentration, i.e. the specified values can be held to much closer tolerances than heretofore. This is particularly true with respect to control of the surface breakdown characteristic. In addition, the use of arsenic to form the n++ region has been found to be quite advantageous, because the arsenic concentration profile is much more abrupt than that of phosphorous, and the implantation is shallower. Thus the position of the p/n sub-surface junction is more controllably established, thereby reducing the degree of uncertainty in the concentration level of the boron at the junction, and requiring less boron.

A modified Zener diode structure is shown in FIGS. 8-10. This configuration provides for processing with only a single additional mask for forming the buried-Zener diode, rather than two additional masks as in the preferred embodiment described above.

Referring now also to the flow diagram of FIG. 11, the wafer is first treated in accordance with the standard preliminary steps of bipolar processing, as well known in the art. Then, an oxide layer of $\geq 4000$ Å is formed on the wafer surface, and the conventional base region definition step is carried out (Mask 3). This definition step however includes formation of a Zener diode base region generally indicated at 50 (having essentially the same outline in plan view as the base 22 of FIG. 2). This region is etched to bare silicon.

Next, the wafer receives a thin screen oxide layer of about 300–3000 Å, covering the bare silicon of the region 50. Nitride then is applied over the oxide to a depth of about 500–1500 Å. It should be noted that any film which does not etch as rapidly as $SiO_2$ in HF may be used for this layer. The single additional mask (Mask 2.7) then is used to define an elongated rectangular area, generally indicated at 52, which will receive both an n++ and p++ ion implantation for the Zener diode.

In preparation for these implantations, the region 52 first is etched to remove the nitride, leaving the thin screen oxide in the generally square central section 54 of region 52. The rest of region 52 has the thicker oxide layer without any nitride covering. The rest of the base region 50, beyond the central section 54, has the thin oxide layer, covered by the nitride previously laid down, and hardened photo-resist. The remainder of the wafer, outside of regions 50 and 52, carries the thick oxide, covered by the nitride and hardened photoresist.

The p++ boron ion implantation now is made, illustratively at an energy of 50–200 keV and a concentration of $2-10 \times 10^{14}$ ions/cm$^2$. An implantation of this intensity will pierce the thin oxide layer in the central section 54 and enter the silicon beneath that layer. In other areas, the ions will enter both the thick oxide layer and the hardened photo-resist over the nitride, but will not penetrate to the silicon in either case.

The photo-resist then is stripped off by sulfuric acid, and a buried-Zener anneal is carried out, e.g. at 1150°–1250° C. for 30–300 minutes low oxygen ambient. This anneal drives in the p++ implant to a depth of about 3–6 microns, as generally illustrated at 56.

Next, the wafer is subjected to a buffered oxide etch, for about 10 minutes. This etch removes oxide at a rate of about 1300 Å per minute, and thus in 10 minutes will strip the oxide from the elongate region 52, leaving bare silicon exposed. In addition, since the etch does not strip off the nitride cover, there will be a lateral-etch removal of oxide beneath the nitride. This forms an undercut region about the periphery of the elongate region 52, exposing bare silicon beyond the periphery of that region out to a distance of perhaps 2 microns or so. The nitride layer now is removed by a hot phosphoric etch, leaving the thin oxide coating over the base region 50 (except for the exposed silicon in the slightly enlarged central section 42), and also leaving the thick oxide layer in the field beyond the defined regions.

A p+ implantation of boron ions now is made, for example, at an energy of 50–200 keV and a concentration of $2-6 \times 10^{14}$ ions/cm$^2$. This implantation enters the defined base region 50, including the bare silicon of the already-implanted central section 54 and the regions beyond the periphery of section 54. These latter regions carry the thin layer of oxide, but the ion implant energy is sufficient to pierce that oxide and penetrate the silicon. (It may be noted that the p+ implant also will enter the bare silicon of region 52 beyond central section 54, but this has no effect on the ultimate functioning of the device.

Next, a base anneal is carried out, for example at a temperature of $\geq 1150°$ C. for $\geq 30$ minutes in a low oxygen ambient. This anneal is followed by an arsenic n++ implant, illustratively at an energy of 30–200 keV, and a concentration of $2-10 \times 10^{15}$ ions/cm$^2$. The arsenic ions will enter the bare silicon defined by the region 52, as enlarged by the under-cut region developed by the 10-minute buffered oxide etch carried out prior to removal of the nitride, as described above.

Ions from this arsenic implantation will of course also enter the thin oxide layer in the base region 50 and the thick oxide layer elsewhere, but the thickness of the thin oxide and the energy of the implantation can be configured so that the arsenic ions have not sufficient range to penetrate to the silicon of the wafer. Before annealing the arsenic implant, this incidental arsenic implantation is removed, to prevent diffusion of the ions into portions of the silicon where they could adversely affect performance. For this purpose the wafer next is subjected to a 15-second buffered oxide etch, to remove about 1000 Å of the oxide coatings. This eliminates the surface portions of the oxide carrying the arsenic ions. After removal of these arsenic ions, a low-temperature oxide (LTO) deposition is performed to build up a layer of about 6000 Å on the bare silicon, as well as on the remaining oxide.

A second buried-Zener anneal now is performed, for example at a temperature of 1000°–1150° C. for 10–90 minutes in a low oxygen ambient. This drives in the arsenic ions to form the final junction dispositions for the buried-Zener diode. Thus, a horizontal sub-surface junction 58 is formed between the n++ ions and the already implanted p++ ions.

Thereafter, during the usual emitter definition step for the NPN transistors of the wafer, an offset emitter region 60 is defined for the buried-Zener diode. The conventional phosphorous diffusion into the wafer produces at this region 60 a corresponding diffusion which overlaps the arsenic ion implantation region (see FIG. 10). Formation of surface contact metallization at this diffusion 60 establishes electrical connection to the n++ arsenic implant of the buried-Zener diode.

The arsenic n++ diffusion into the bare silicon of region 52, as enlarged by the under-cut produced by the 10-minute buffered oxide etch, will overlap the original p++ boron implantation. That is, the n++ ions will extend out beyond the p++ ions in every direction. This lateral extension of the n++ ions in the base region 50 is sufficient so that the n++ ions will interface at the surface with the lower concentration (p+) boron ions of the base implantation, rather than the p++ ions. Thus, the surface junction between the arsenic and boron implants will occur in a region of lower boron concentration than exists at the horizontal sub-surface junction 58 between the arsenic n++ implant and the original p++ implant. Accordingly, the Zener breakdown will take place consistently at the subsurface junction rather than at the surface junction, assuring stable diode operation at a desired voltage level.

The ion implantation process steps described hereinabove are performed in accordance with techniques and apparatus which are well known in the art, and therefore no details are set forth in the above description. Equipment for performing such implantation typically utilizes the principles of mass spectroscopy for separation of the ions to be implanted, followed by post acceleration of the ions to the required energy levels. Suppliers of such equipment include Varian and Eaton/Nova.

Although preferred embodiments of the invention have been described hereinabove in detail, it is desired to emphasize that such descriptive material has been presented for the purpose of teaching the concepts and advantages of the invention, and should not be treated as necessarily limiting of the invention since it is clear that many variants and modifications of the invention can be devised by those skilled in the art to meet the requirements of quite different applications.

What is claimed is:

1. The method of forming a buried reference diode in an IC wafer with an epitaxial layer to be formed with bipolar transistors, comprising:
    implanting p-type ions in said epitaxial layer;
    driving said implanted p-type ions into said wafer to a substantial depth;
    developing p-type dopant in said epitaxial layer in a region over said implanted p-type ions and extending out laterally beyond the sides of said implanted p-type ions to accommodate establishing electrical connection to the region of said implanted p-type ions;
    said implanted p-type ions being driven into said wafer a distance substantially greater than the depth of said p-type dopant; and
    implanting n-type ions over said implanted p-type ions to form an all-implanted junction to serve as a reference diode.

2. The method of claim 1, including the steps of:
    forming p-type bases for said bipolar transistors in said epitaxial layer at the same time as and as part of the same procedure for developing said p-type dopant over said implanted p-type ions; and
    forming n-type emitters for said bipolar transistors at the same time as and as part of the same procedure for implanting said n-type ions over said p-type ions.

3. The method of claim 2, wherein said p-type dopant is developed by ion implantation.

* * * * *